United States Patent
Salminen et al.

(10) Patent No.: US 10,813,229 B2
(45) Date of Patent: Oct. 20, 2020

(54) ELECTRONIC MODULE HAVING AN ELECTRICALLY INSULATING STRUCTURE WITH MATERIAL HAVING A LOW MODULUS OF ELASTICITY

(71) Applicant: Infineon Technologies AG, Neubiberg (DE)

(72) Inventors: Toni Salminen, Munich (DE); Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 435 days.

(21) Appl. No.: 14/882,678

(22) Filed: Oct. 14, 2015

(65) Prior Publication Data

US 2016/0113127 A1 Apr. 21, 2016

(30) Foreign Application Priority Data

Oct. 16, 2014 (DE) .................. 10 2014 115 099

(51) Int. Cl.
*H05K 3/28* (2006.01)
*H05K 3/32* (2006.01)
(Continued)

(52) U.S. Cl.
CPC ............. *H05K 3/32* (2013.01); *H01L 23/145* (2013.01); *H01L 23/49822* (2013.01);
(Continued)

(58) Field of Classification Search
CPC ............. H01L 23/145; H01L 23/49822; H01L 23/3128; H01L 24/16; H01L 24/48;
(Continued)

(56) References Cited

U.S. PATENT DOCUMENTS

| 6,114,753 A | 9/2000 | Nagai et al. |
|---|---|---|
| 7,154,046 B2 | 12/2006 | Chung |

(Continued)

FOREIGN PATENT DOCUMENTS

| CN | 101233190 A | 7/2008 |
|---|---|---|
| DE | 10133571 A1 | 1/2003 |

(Continued)

OTHER PUBLICATIONS

Zhang, X. et al.: "Effects of crosslinking, prestrain, and dielectric filler on the electromechanical response of a new silicone and comparison with acrylic elastomer"; in: Proc. SPIE 5385, Smart Structures and Materials 2004: Electroactive Polymer Actuators and Devices (EAPAD), Jul. 27, 2004; S. 78-86; doi: 10.1117/12.540888.

(Continued)

*Primary Examiner* — Ahmed N Sefer

(57) ABSTRACT

Electronic module comprising at least one electronic chip, an encapsulation structure in which the at least one electronic chip is at least partially encapsulated, an electrically conductive structure for the electrically conductive contacting of the at least one electronic chip, and an electrically insulating structure which is at least partially formed from a material having a low modulus of elasticity, wherein a variation of the value of the modulus of elasticity is at the most 10 GPa in a temperature range between −40° C. and +150° C.

18 Claims, 4 Drawing Sheets

(51) Int. Cl.
*H01L 23/498* (2006.01)
*H05K 1/02* (2006.01)
*H01L 23/14* (2006.01)
*H05K 3/46* (2006.01)
*H01L 23/00* (2006.01)
*H05K 1/03* (2006.01)
*H05K 1/14* (2006.01)
*H01L 23/31* (2006.01)

(52) U.S. Cl.
CPC ......... *H05K 1/0271* (2013.01); *H05K 3/4688* (2013.01); *H01L 23/3128* (2013.01); *H01L 23/49816* (2013.01); *H01L 24/16* (2013.01); *H01L 24/48* (2013.01); *H01L 2224/0401* (2013.01); *H01L 2224/04042* (2013.01); *H01L 2224/12105* (2013.01); *H01L 2224/16225* (2013.01); *H01L 2224/16227* (2013.01); *H01L 2224/48091* (2013.01); *H01L 2224/48227* (2013.01); *H01L 2924/00014* (2013.01); *H01L 2924/13055* (2013.01); *H01L 2924/13091* (2013.01); *H01L 2924/14* (2013.01); *H01L 2924/15311* (2013.01); *H01L 2924/181* (2013.01); *H05K 1/0366* (2013.01); *H05K 1/0373* (2013.01); *H05K 1/141* (2013.01); *H05K 1/144* (2013.01); *H05K 3/284* (2013.01); *H05K 2201/015* (2013.01); *H05K 2201/0141* (2013.01); *H05K 2201/0209* (2013.01); *H05K 2201/068* (2013.01)

(58) Field of Classification Search
CPC .. H01L 2224/0401; H01L 2224/04042; H05K 3/32; H05K 1/0271; H05K 3/4688
See application file for complete search history.

(56) References Cited

U.S. PATENT DOCUMENTS

| | | | |
|---|---|---|---|
| 2001/0028072 A1* | 10/2001 | Aoki | G01L 19/141 257/254 |
| 2003/0155145 A1* | 8/2003 | Ou | H01L 23/36 174/534 |
| 2006/0103003 A1* | 5/2006 | Heide | H01L 23/3135 257/700 |
| 2006/0139893 A1* | 6/2006 | Yoshimura | H01L 25/0657 361/735 |
| 2007/0251721 A1 | 11/2007 | Kiuchi et al. | |
| 2007/0278671 A1 | 12/2007 | Fan | |
| 2008/0036083 A1* | 2/2008 | Sawada | H01L 21/563 257/737 |
| 2008/0157358 A1* | 7/2008 | Yang | H01L 23/5389 257/737 |
| 2009/0090547 A1 | 4/2009 | Kariya et al. | |
| 2011/0108977 A1 | 5/2011 | Lin et al. | |
| 2013/0026632 A1 | 1/2013 | Kikuchi et al. | |
| 2013/0256894 A1 | 10/2013 | Adema | |

FOREIGN PATENT DOCUMENTS

| | | | |
|---|---|---|---|
| JP | 11-163002 | * | 6/1999 |
| JP | 2000-114424 | * | 4/2000 |
| JP | 2008-244325 | * | 10/2008 |

OTHER PUBLICATIONS

X. J. Fan; B Varia; Q. Han, Design and optimization of thermo-mechanical reliability in wafer level packaging, Microelectronics Reliability, 2010, 536-546, 2009 Elsevier Ltd.

C. C. Schuckert; J. L. Wyant, Qualification of a spin apply, photodefinable polymer for packaging of automotive circuits, Solid State Technology, Nov. 2000, PennWell Corporation.

* cited by examiner

ELECTRONIC MODULE HAVING AN ELECTRICALLY INSULATING STRUCTURE WITH MATERIAL HAVING A LOW MODULUS OF ELASTICITY

BACKGROUND

1. Field

Various embodiments relate in general to an electronic module, an electronic arrangement and a method for manufacturing at least one electronic module.

2. Description of the Prior Art

Electronic modules can have one or more electronic chips that are encapsulated, for example in an encapsulation structure and can be connected via electrically conductive contacts to an electronic peripheral.

However, it can lead to damage of such electronic modules when these are exposed to temperature cycles.

SUMMARY

There could be a need for an electronic module that is robust against temperature fluctuations.

According to an exemplary embodiment, an electronic module is provided comprising at least one electronic chip, an encapsulation structure in which the at least one electronic chip is at least partially encapsulated, an electrically conductive structure for the electrically conductive contacting of the at least one electronic chip, and an electrically insulating structure which is at least partially formed from a material having a low modulus of elasticity, wherein a variation of the value of the modulus of elasticity is at the most 10 GPa (gigapascals, where 1 GPa=$10^9$ kg m$^{-1}$ s$^{-2}$) in a temperature range between −40° C. and +150° C.

According to another exemplary embodiment, an electronic arrangement is created having the at least one electronic module with the features described above and an electronic peripheral device, on which the at least one electronic module is mounted, such that the at least one electronic chip is coupled electrically conductively by the electrically conductive structure to the electronic peripheral device.

According to yet another exemplary embodiment, a method for producing an electronic module is provided, in which the method at least one electronic chip is at least partially encapsulated with an encapsulation structure, an electrically conductive structure for the electrically conductive contacting of the at least one electronic chip is formed and an electrically insulating structure is at least partially formed from a material having a low modulus of elasticity, wherein a variation of the value of the modulus of elasticity is at the most 10 GPa in a temperature range between −40° C. and +150° C.

According to an exemplary embodiment, an electrically insulating structure of the module or package is partially or completely formed from a material having a low modulus of elasticity or Young's modulus in an electronic module. Such a material is elastic and flexible and therefore allows protection against undesirable cracks or other mechanical damage, despite temperature fluctuations in the range between extremely cold operating temperatures and extremely hot operating temperatures of an electronic module, in particular an electrical contact connection between the electronic module and an electronic peripheral device on which the electronic module is mounted. The property of the low modulus of elasticity of the electrically insulating structure clearly equalizes mechanical stresses which continually act on the electronic module and its connection point to an electronic peripheral device during repeated temperature cycles. According to an exemplary embodiment, the material having the low modulus of elasticity (in particular, low with respect to the corresponding conventionally used materials, such as FR-4, i.e., a resin-fiber glass mixture) has the further advantageous property that it does not experience a change of the value of the modulus of elasticity or Young's modulus of at the most 10 GPa over the typical operating temperature range (for example, for automotive and other applications) of −40° C. (i.e., low temperatures in winter) to +150° C. (i.e., high operating temperature in summer at high load). During statically very low or very high temperatures, the electronic module is not only reliably protected by this at an electric coupling point to an electronic peripheral device on which the electronic module can be mounted in operation, but also against crack formation or other mechanical damage during frequent and wide ranging thermal cycling. Such an electronic module thus has high reliability and good electronic performance.

DESCRIPTION OF FURTHER EMBODIMENTS

In the context of the present invention, the term "material having a low modulus of elasticity" may particularly refer to a material whose modulus of elasticity is smaller than that of FR-4. In other words, the material having a low modulus of elasticity can have more elastic and more mechanically flexible properties than conventional FR-4 material used for electronic modules or packages. A material having a low modulus of elasticity will be suitable to support compensatory movement among different components of the electronic module under the influence of mechanical loads from temperature cycles within the operating range of the electronic module and thus to prevent thermally induced damage (in particular crack formation).

The above effects are particularly strongly pronounced if the variability over the entire temperature range mentioned is less than 3 GPa. According to an exemplary embodiment, the variation of the value of the modulus of elasticity may be between 2 GPa and 3 GPa in the given temperature range. As a result, undesirable crack formation under thermal stress can practically be eliminated completely.

According to an exemplary embodiment, the material having a low modulus of elasticity may have an absolute value of the modulus of elasticity of at the most 16 GPa at −40° C. The choice of material having the low modulus of elasticity has the effect that a value of 16 GPa is not exceeded, even at the lower range of typical operating temperatures, even at the most critical low temperatures at which susceptibility to cracking of the electronic module has been found to be particularly serious, the electronic module can be operated without concern for loss of proper electrical coupling characteristics to an electronic peripheral device. If the value of the modulus of elasticity of the material having a low modulus of elasticity at −40° C. is thus still at the most 16 GPa, this material still has sufficient elasticity in the lower temperature range (i.e., at −40° C.) to compensate for mechanical stresses and to increase reliability.

According to an exemplary embodiment, the material having a lower modulus of elasticity may have an absolute value of the modulus of elasticity of at the most 5 GPa in the entire temperature range between −40° C. and +150° C. It has been shown that the service life of the electronic module can be significantly increased for a variability of the Young's modulus of at the most 5 GPa over the entire typical operating range. Such an electronic module withstands frequent thermal cycling not only reliably, but also over a particularly high period of time.

It should be noted that the low variabilities and absolute values of the modulus of elasticity of the material of the electrically insulating structure can refer either to all three spatial directions respectively (thus may refer to materials with isotropic moduli of elasticity), but also can refer to materials that have an anisotropic modulus of elasticity. In the latter case, it is particularly advantageous, according to exemplary embodiments, when the characteristic of low modulus of elasticity for the material is also realized in a mounting plane of the electronic module.

According to an exemplary embodiment, the material having a low modulus of elasticity may be free of glass fibers. This can have a positive effect on the then very distinctive elastic properties and a moderate thermal expansion. Although in certain embodiments, the material having a low modulus of elasticity may also have glass fibers, it may be preferred according to other embodiments to provide a material free of glass fibers having a low modulus of elasticity, to thereby reduce the rigidity and to thereby further promote the ability for compensatory movements in the case of thermal mismatches.

According to an exemplary embodiment, the material having a low modulus of elasticity can have elastic, in particular elastomeric, properties under temperature load. This can support or impart compensatory movements among components of the electronic module for the reduction of thermal mismatch.

According to an exemplary embodiment, the material having a low modulus of elasticity may be selected from a group consisting of Taconics TSM-DS3, Taconics FastFilm, Panasonic LCP R-F705T, and Rogers 3003. It is possible that the material having a low modulus of elasticity has Teflon (polytetrafluoroethylene). All these named materials have the advantage of having a low modulus of elasticity of less than 16 GPa at −40° C., at the same time of showing a variability of no more than 10 GPa over the entire critical temperature range of −40° C. to 150° C., a variability of at the most 10 GPa and simultaneously having sufficiently moderate thermal expansion coefficients. Therefore, the selected materials are particularly well suited as the material having the low modulus of elasticity.

According to an exemplary embodiment, the electrically insulating structure may have a layer of the material having a low modulus of elasticity. This layer may be planar and be continuous or structured.

According to an exemplary embodiment, the electronic module can be formed as a ball grid array (BGA) module, in particular as an embedded wafer level ball grid array (eWLB) module. It has been shown that, for BGA modules or for eWLB modules, the susceptibility for crack formation is particularly critical during mounting of the BGA module or eWLB module on a printed circuit board as an electronic peripheral device and can be controlled particularly effectively by measures described herein with regard to the material having a low modulus of elasticity.

According to an exemplary embodiment, the electrically conductive structure and the electrically insulating structure may form a laminate sequence of layers on which a main surface of the at least partially encapsulated at least one electronic chip is arranged and on which another main surface the electronic module is mounted or can be mounted on a peripheral electronic device. The electrically insulating structure and the electrically conductive structure may be formed from an alternating sequence of conductive and dielectric layers, which may additionally have intermediate contacts. It has been shown that, in particular for laminate based electronic modules or packages in which a series of layers of the electrically conductive structure and the electrically isolating structure is arranged between the encapsulated electronic chip and the electronic peripheral device, the designing of the electrically insulating structure at least in part from a material having a low modulus of elasticity, the robustness against temperature cycles and the service life of the electronic module can be significantly increased. Clearly, the mechanical stress resulting from the temperature cycles which is related to the differently pronounced thermal expansion of components of the electronic module, can be cushioned by the sufficiently elastic properties of the materials having the low modulus of elasticity.

According to an exemplary embodiment, the electrically insulating structure apart from the section of the material having the low modulus of elasticity may have another section from a different material having a (compared to it) higher modulus of elasticity. The material having the comparatively higher modulus of elasticity can be a resin-fiber glass mixture, in particular FR-4. In other words, the electrically insulating structure may be formed as a structure with different dielectric materials. The material having the lower modulus of elasticity is therefore used for providing flexibility and elasticity in order to be able to have a compensating or circumventive effect on mechanical stresses associated with temperature variations. On the other hand, a material of higher robustness or hardness may be provided, which allows sufficiently high mechanical stability and robustness against damage to the laminate sequence of layers, even under adverse external conditions. With a mixture of the electrically insulating structure of material having a lower [and] having a higher modulus of elasticity, locally defined areas of higher elasticity and areas of higher robustness can thus be sectionally created in order to provide a balance between flexibility and rigidity.

According to an exemplary embodiment, at least one part of the other material having the higher modulus of elasticity may be arranged between the at least partially encapsulated at least one electronic chip on the one hand and the material having the low modulus of elasticity on the other hand. Through this configuration, the material having the low modulus of elasticity can be brought particularly close to the electrical interface between the electronic module/package on the one hand and the electronic peripheral device (in particular a PCB) on the other hand in order to protect the electrical coupling (in particular by a solder connection) found at this vulnerable point against crack formation under temperature load. At the same time, the material having the higher modulus of elasticity and the higher mechanical hardness or robustness arranged near the electronic chips gives the electronic module as a whole good stability and especially protects the sensitive electronic chip.

According to an exemplary embodiment, the electronic module may have at least one bonding wire encapsulated at least partially in the encapsulation structure to the electrically conductive coupling of at least one chip pad on an upper side of the at least one electronic chip to the electrically conductive structure on an underside of at least one electronic chip. In such an embodiment, the bonding wire connecting a particular upper side active surface of the electronic chip to the electrically conductive structure on the bottom side of at least one electronic chip, in which the bonding wire is encapsulated together with the at least one electronic chip in the encapsulation structure.

According to another exemplary embodiment, at least part of the material having the lower modulus of elasticity may be arranged between the at least one electronic chip partially encapsulated on the one hand and the other material having the higher modulus of elasticity on the other hand. The arrangement of the material having the lower modulus of elasticity on an end of the electronically insulating structure facing the electronic chip is particularly advantageous where the risk of crack formation at an electrical contacting to a bottom side of the electronic chip is to be feared, particularly with flip chip architectures. In this case, the softer, more deformable character of the material having the low modulus of elasticity can locally equalize mechanical stresses occurring at the chip contacting, while the harder or more robust material having the higher modulus of elasticity can give mechanical protection and stability, which is then, in comparison to the material having the low modulus of elasticity, arranged on the chip's far side.

According to an exemplary embodiment, the electronic module may have at least one chip pad on a bottom side of the at least one electronic chip mounted in flip chip technology, wherein the at least one chip pad at the bottom side is coupled directly electrically conductively to the electrically conductive structure. In such a flip chip architecture, the active upper surface of the electronic chip is on the bottom side or on the [the] electronically conductive structure and chip side facing the electrically insulating structure. Research has shown that a critical point of the electrical contacting in this geometry occurs at the chip pads for connecting the electronic chip to the laminate structure or the layer stack of components of the electrically insulating structure and the electrically conductive structure. Such a geometry can be particularly free of bonding wire.

According to another exemplary embodiment, the electrically conductive structure may be embedded as rewiring in the electrically insulating structure, so that the electrically conductive structure and the electrically insulating structure form a "redistribution layer", on which a main surface of the at least one electronic chip and the encapsulation structure adjoin and on whose other main surface the electronic module can be mounted to an electronic peripheral device. In such an eWLB architecture, the redistribution layer is designed between the encapsulated electronic chip on the one hand and a mounting plane for electrically and mechanically coupling an electronic peripheral device (such as a PCB) on the other hand. Using this redistribution layer the electrically conductive materials (especially copper) can be formed from one or more layers made of electrically insulating material with embedded structures, the small chip dimensions (i.e., the relatively small expansion of the chip pad(s)) are adapted and expanded to the relatively large dimensions of the electronic peripheral device (especially conductive structures of a PCB). In such an eWLB architecture, one of the vulnerable points for damage to the electronic module or an arrangement for electronic module and electronic peripheral device is that at which the electrically conductive coupling is established between the electronic module and the electronic peripheral device, in particular at a solder connection point. Mechanical stresses at this position can be compensated by the at least partial designing of the electrically insulating structure from a material having a low modulus of elasticity (particularly low compared to FR-4 material of a PCB).

According to an exemplary embodiment, the other material having the higher modulus of elasticity can be arranged between the at least one electronic chip at least partially encapsulated with the encapsulation structure on the one hand and the material having the low modulus of elasticity on the other hand. By this measure, the mechanically sensitive electrical transition between chip and redistribution layer can be mechanically reinforced.

According to another exemplary embodiment, the entire electrically insulating structure of the redistribution layer may be formed from the material having the low modulus of elasticity. If the entire electrically insulating structure of the redistribution layer consists of the material having a low Young's modulus, a particularly high flexibility and compensation capability compared to thermal mismatch based on mechanical stresses can be achieved.

According to an exemplary embodiment, at least one solder structure, especially a plurality of solder beads, can be arranged on the other main surface of the laminate sequence of layers (i.e., on that other main surface which lies opposite to the main surface described above, to which the chip is mounted). In particular, the electrical coupling to this solder structure in a transition area between the electronic module and electronic peripheral device needs the provision of a certain mechanical compensation capability, so that cracks are avoided here under the influence of thermal stresses and the reliability of the electronic component, package or module can be increased.

According to an exemplary embodiment, the electronic peripheral device may be selected from a group consisting of a circuit board, in particular a printed circuit board, a ceramic substrate, a direct copper bonding (DCB) substrate and a direct aluminum bonding (DAB) substrate.

According to an exemplary embodiment, the electronic peripheral device may also have an electrically insulating structure that is at least partially formed of a material having a low modulus of elasticity (in particular less than FR-4). It has been shown to be especially advantageous to equip both an area of the electronic module as well as an area of the electronic peripheral device with material of a low modulus of elasticity. The embodiments apply to the possible materials having a low modulus of elasticity (and their properties) of the electronic peripheral device, that are described for the material having a low modulus of elasticity of the electronic module, so that there is an express reference to the relevant disclosure in this application. The electronic arrangement of electronic module and electronic peripheral device can be highly effectively protected against mechanical damage such as cracks by the bilateral synergistic provision of mechanical compensation capability through the elasticity of the respective materials' low modulus of elasticity on package and peripheral device. The service life of the module and the peripheral device in the mounted state can thereby be significantly increased.

The values, ranges of values and variabilities of the modulus of elasticity relating to values specified in the context of this application can be measured, especially by the measurement methods DMA (dynamic mechanical analysis).

According to an exemplary embodiment, increased robustness against temperature cycles can be achieved, especially for laminate based packages (such as BGA) by the use of one or more materials having a low Young's modulus as a dielectric. This is particularly advantageous for automotive applications or applications using power chips as an electronic chip since additional thermal load occurs for the waste heat in operation there, in addition to the requirement of usability over a wide temperature range. An important aspect of exemplary embodiments is to be seen in that dielectric material having a low Young's modulus for one or more laminate layers of substrate or as a dielectric layer in certain packages (such as eWLB) is used, especially where electrical contacting takes place externally to this layer (for example, a solder or adhesive connection to an electrically conductive body such as a copper post, or a soldering or gluing on a PCB).

The provision of at least a portion of the electrically insulating structure of the electronic module made of material having a low modulus of elasticity compared to a sole provision of such a material in the typically much larger electronic peripheral device brings significant cost benefits, since the region that is designed from material having a low modulus of elasticity for facilitating the thermal compensatory movement is usually very much smaller in the electronic module than in the electronic peripheral device. The use of a material having a low modulus of elasticity also simultaneously brings the advantage that such materials improve the suitability of the electronic module for high-frequency applications with low loss of a transmitted signal.

According to an embodiment, the electronic chips can be used as sensors or actuators in micro-electro-mechanical systems (MEMS), for example, as pressure sensors or accelerometers. In another embodiment, the electronic chip can be used as semiconductor chips for power applications (in particular with vertical current flow and/or with electrical contacts on both opposite main surfaces), for example for automotive applications, and can, for example, have at least one integrated insulated gate bipolar transistor (IGBT) and/ or at least an integrated diode. It is also possible that at least a part of the electronic chip is designed for power applications, particularly as a power semiconductor chip, for example, as a field effect transistor (in particular as MOSFET). According to an embodiment, at least one electronic chip is a logic IC (for example, with electrical contacts on only one of two opposite main surfaces) or an electronic chip for high frequency power connections. It is also possible to use passive elements as electronic chips, for example resistors, inductors and/or capacitors.

A semiconductor substrate can be used as a substrate or wafer to form the electronic chip, preferably a silicon substrate. Alternatively, silicon oxide or another electrically insulating substrate may be used. It is also possible to use a germanium substrate or a III-V semiconductor material. For example, exemplary embodiments can be realized in gallium nitride or silicon technology. Further, exemplary embodiments can use standardized semiconductor process technologies, such as an appropriate etching technology (comprising isotropic and anisotropic etching, in particular plasma etching, dry etching, wet etching), structuring technology (which can involve lithographic masks) and/or deposition technologies (such as chemical vapor deposition (CVD), plasma enhanced chemical vapor deposition (PECVD), atomic layer deposition (ALD), sputtering, etc.).

In one embodiment, the encapsulation structure may be a cast or mold structure, for example, made of plastic. The encapsulation structure may also have filler particles, for example, to increase the thermal conductivity. In another embodiment, the encapsulation structure may be formed by pressing the chips with this surrounding material.

The above and other goals, features and advantages will become more specifically apparent from the following description and the appended claims, when they are considered in conjunction with the accompanying drawings, in which corresponding parts or elements are provided with corresponding reference numerals.

BRIEF DESCRIPTION OF THE FIGURES

Exemplary embodiments are illustrated in the figures and are explained in more detail below.

Illustrated are.

DETAILED DESCRIPTION OF EXEMPLARY EMBODIMENTS

Figure 1:
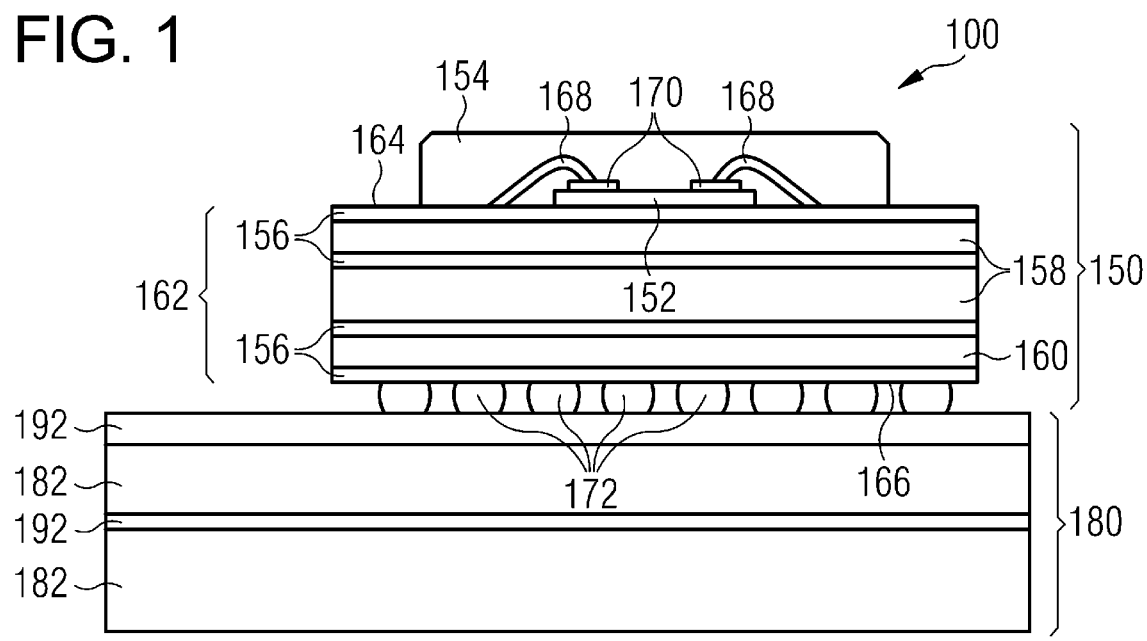
FIG. 1 is a cross-sectional view of an electronic arrangement according to an exemplary embodiment.

Identical or similar components in different figures are provided with identical reference numerals.

FIG. 1 shows a cross-sectional view of an electronic arrangement 100 according to an exemplary embodiment. In FIG. 1, the integration of a material having a low modulus of elasticity into a substrate of a ball grid array (BGA) module is shown.

The electronic arrangement 100 has an electronic module designed as a laminate-based package, IC package, microcontroller package, eWLB, chip scale package or power semiconductor package here and an electronic peripheral device 180 designed as a printed circuit board (PCB) here, on which the electronic module 150 is electrically and mechanically mounted by a soldered connection. The electronic peripheral device 180 is formed from an electrically insulating structure 182 of FR-4 material that is penetrated by electrically conductive structures (see electrically conductive structure 192). An electronic chip 152 of the electronic module 150 designed as an IC chip or power semiconductor chip here is electrically conductively coupled to an upper side of the electronic peripheral device 180 by an electrically conductive structure 156 of the electronic module 150 with a metallic conductive path.

The electronic module 150 further has an encapsulation structure 154 designed as a mold compound or potting compound, in which the electronic chip 152 is encapsulated together with bonding wires 168 and the upper side chip pads 170. The electrically conductive structure 156 of the electronic module 150 manufactured, for example, from copper, is used for the electrically conductive contacting of the electronic chip 152. More specifically, the uppermost layer of the electrically conductive structure 156, according to FIG. 1, is electrically conductively coupled to the chip pads 170 on the upper side of the electronic chip 152 by the bonding wires 168. In FIG. 1, connecting structures, not shown, which extend through an electrically insulating structure 158, 160, connect the upper layer of the electrically conductive structure 156, according to FIG. 1, to the further layers arranged below. The lowest layer of the electrically conductive structure 156 is electrically conductively coupled to the electrically conductive structure of the electronic peripheral device 180 by electrically conductive solder beads 172. The solder beads 172 are arranged on a lower main surface 166 of a laminate sequence of layers 162, which is formed from the electrically conductive structure 156 and the electrically insulating structure 158, 160. Together with the electrically insulating structure 158, 160, the electrically conductive structure 156 thus forms a layer stack of mutually parallel, planar layers which can be designed continuous or structured. The encapsulated electronic chip 152 is coupled on an upper main surface 164 of the laminate sequence of layers 162.

The electrically insulating structure 158, 160 has a first layer (see reference numeral 160) of a material having a low modulus of elasticity in comparison with FR-4 and has second layers (see reference numeral 158) of FR-4 with a higher a modulus of elasticity.

The material having the low modulus of elasticity has an absolute value of the modulus of elasticity of at the most 16 GPa at −40° C., whereby the absolute value changes in a temperature range between −40° C. and +150° C. to a maximum of 10 GPa (usually reduced toward higher temperatures). Through this combination of material properties of the layer with reference numeral 160, this can give sufficient elasticity and flexibility to the electronic module 150 as a whole even with pronounced temperature cycles (for example, in a range between −40° C. and +150° C.), that mechanical stresses can be compensated due to different thermal expansion coefficients of the individual materials of the electronic module 150 and of the thus coupled electronic peripheral device 180 and in particular the solder connection at the position of solder beads 172 is protected from crack formation. The moderate thermal expansion of the material having the low modulus of elasticity further suppresses undesired crack formation.

The electrically conductive structure 156 and the electrically insulating structure 158, 160 form the laminate sequence of layers 162, on which one main surface 164 the encapsulated electronic chip 152 is arranged and on whose other main surface 166 the electronic module 150 is to be mounted on the electronic peripheral device 180.

Undesirable cracking at the position of the solder beads 172 can be suppressed particularly effectively when the above-described material properties of the material having the low modulus of elasticity and the moderate thermal expansion at least exist in a plane, which according to FIG. 1 extends horizontally and is arranged perpendicular to the paper plane according to FIG. 1.

The electrically insulating structure 158, 160 also has a laminate (e.g., FR-4) as other materials having a higher modulus of elasticity. This gives the electronic module 150 the necessary stability to also be able to be used under harsh conditions. According to FIG. 1, the other material having the higher modulus of elasticity is arranged between the encapsulated electronic chip 152 on the one hand and the material having a low modulus of elasticity on the other hand. Thus a high robustness at the coupling point between the electronic chip 152 and laminate sequence of layers 162 is achieved and simultaneously a [the] desired compensatory movement enabling elastic coupling at the interface between the electronic module 150 and the electronic peripheral device 180 is created.

If mechanical stresses occur over a wider temperature range, for example, between −40° C. (i.e., after a cold start in winter) and +150° C. (i.e., at the height of summer, if, for example, the electronic chip is also operated at high load), due to the different thermal expansion coefficients of the different materials of the electronic arrangement 100 in its interior, the, for example, even almost rubbery flexibility of the material 160 having a low modulus of elasticity provides for a reduction of these stresses and for a compensatory movement between the individual components of the electronic arrangement 100. Especially critical are those mechanical stresses close to the solder beads 172, where conventionally, susceptibility to crack formation and deterioration of the electrical contacting is particularly high. In that the material according to FIG. 1 having a low Young's modulus (see reference numeral 160) is provided spatially nearest to this critical position, this sensitive position can especially be mechanically relieved and at the same time, good mechanical stability of the electronic module 150 can be ensured based on the provision of the FR-4 material in the form of layers removed from the solder bead of the electrically insulating structure (see reference numeral 158). By incorporating material having a low Young's modulus into the substrate of a BGA package, as shown in FIG. 1, improved performance may thus be achieved over many and pronounced temperature cycles and the reliability at the interface between BGA package and PCB can in particular be improved.

Figure 2:
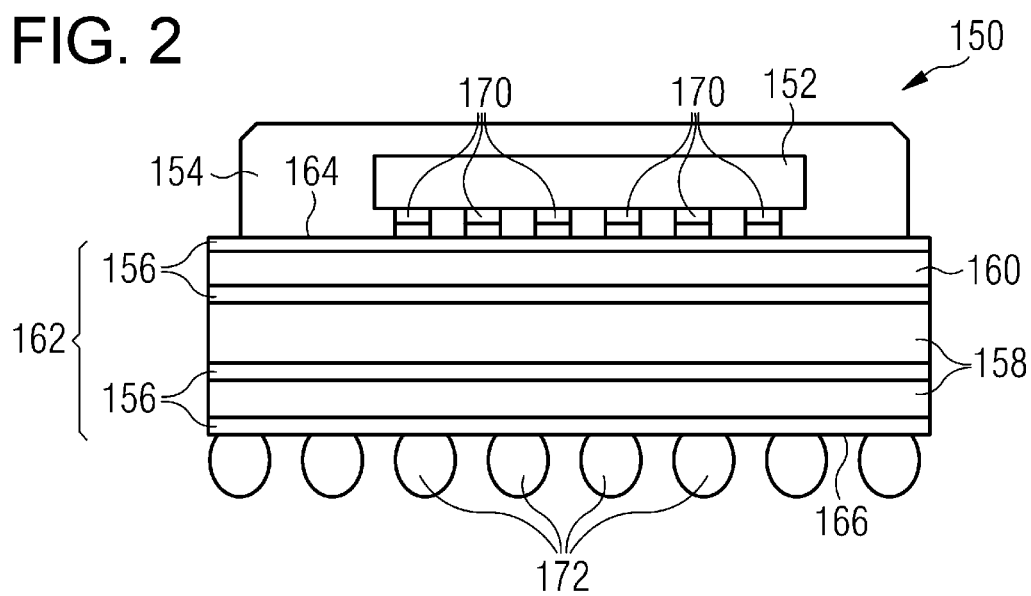
FIG. 2 is a cross-sectional view of an electronic module according to an exemplary embodiment.

FIG. 2 shows a cross-sectional view of an electronic module 150 according to another exemplary embodiment.

The material having the low modulus of elasticity (see reference numeral 160) is, according to FIG. 2, arranged between the encapsulated electronic chip 152 on the one hand and the other material having the higher modulus of elasticity (see reference numeral 158) on the other hand.

According to FIG. 2, the electronic module 150 has chip pads 170 on a bottom side of the electronic chips 152 mounted here in flip chip technology. The chip pads 170 on the bottom side of the electronic chip 152 are electrically conductively coupled to an uppermost layer according to FIG. 2, i.e., to the main surface 164 of the laminate sequence of layers 162, of the electrically conductive structure 156.

The embodiment according to FIG. 2 differs from the exemplary embodiment according to FIG. 1, thus, according to FIG. 2, the material 160 having a low Young's modulus is integrated into a flip chip laminate substrate. With this geometry, a critical point susceptible to cracking is the transition between the chip pads 170 on the active side of the electronic chip 152 and the laminate layer stack 162 made of the electrically insulating structure 158, 160 and the electrically conductive structure 156. As the material having a low Young's modulus is specifically provided at this position, crack formation at this point is effectively inhibited even under extreme temperatures and temperature fluctuations. A significant increase in service life and reliability can be achieved through this, in particular, for flip chip BGAs. The reliability at the chip-substrate interface can be increased, if, as shown in FIG. 2, the material having a low modulus of elasticity is localized at this position.

Figure 3:
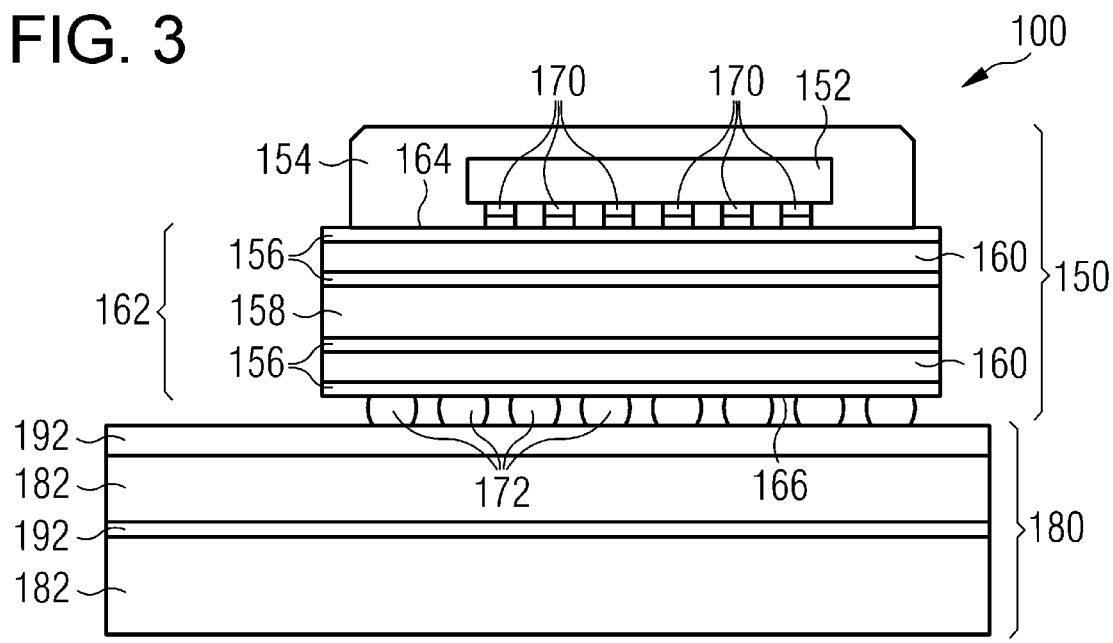
FIG. 3 to FIG. 5 are cross-sectional views of electronic arrangements according to still other exemplary embodiments.
Figure 4:
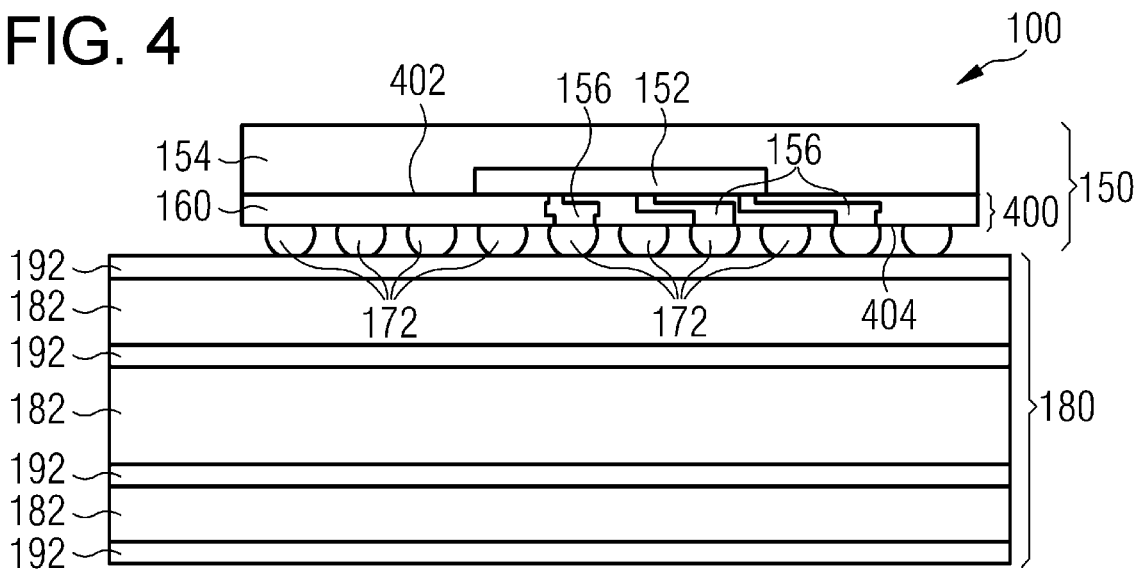
Figure 5:
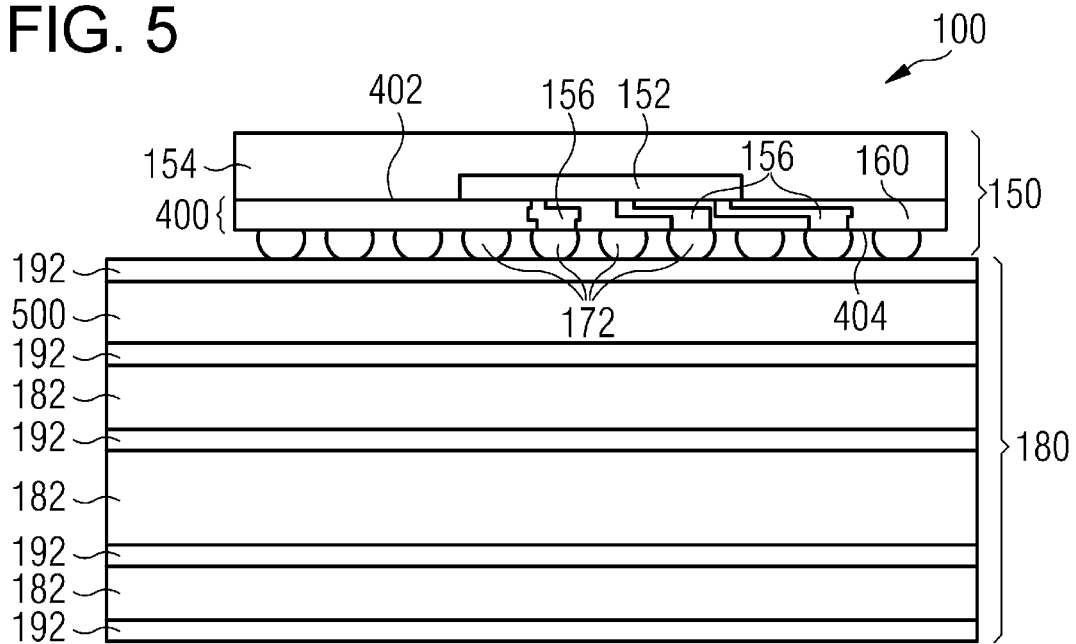

FIG. 3 to FIG. 5 show cross-sectional views of electronic arrangements 100 according to still other exemplary embodiments.

The embodiment shown in FIG. 3 differs from the embodiment shown in FIG. 2 in particular in that additional material having a low modulus of elasticity is provided in the form of another corresponding layer in a boundary region between the electronic module 150 and electronic peripheral device 180. The reliability at the interface or the transition (i.e., at the position of the solder beads 172) between the substrate of the electronic module 150 and the electronic peripheral device 180 can also be improved by this in the form of a PCB, in which mechanical compensatory movement under thermal stress is also enabled there based on the elastic characteristics designed there.

By means of the measures according to FIG. 2 and FIG. 3, it is possible to use flip chip technology for automotive applications, where robustness against extreme temperature cycles is required.

According to FIG. 4, the electrically conductive structure 156 is embedded as rewiring in the electrically insulating structure, so that the electrically conductive structure 156 and the electrically insulating structure together form a "redistribution layer" 400, on whose one main surface 402 the electronic chip 152 and the encapsulation structure 154 adjoin and on whose other main surface 404 the electronic module 150 is mounted or can be mounted to the electronic peripheral device 180 by the solder beads 172. In the embodiment of FIG. 4, the entire electrically insulating structure of the redistribution layer 400 is made of material formed having the low modulus of elasticity (see reference numeral 160).

The embodiment according to FIG. 4 differs from the embodiments described above in that this shows an electronic module in eWLB technology. According to FIG. 4, the entire dielectric material of the redistribution layer 400 consists of the material having the low modulus of elasticity, so that the electrical coupling between the electronic module 150 and the electronic peripheral device 180 is mechanically and flexibly formed by the solder connection, which is realized by the solder beads 172, and compensatory movement allowed. Thus, the material having a low modulus of elasticity according to FIG. 4 can be integrated directly into an eWLB. The material 160 with a low modulus of elasticity is thereby used as a dielectric on the eWLB side. It thus serves as an electrical insulation material within the redistribution layer. In turn, improved robustness can be achieved against temperature fluctuations through this, even if the eWLB architecture is used according to FIG. 4 with conventional PCBs.

According to FIG. 5, in contrast to FIG. 4, the electronic peripheral device 180 has an electrically insulating structure 182, 500, which partially is formed of a material having a low modulus of elasticity (see reference numeral 500) and partly of a material having a higher modulus of elasticity (for example, FR-4).

FIG. 5 therefore shows an embodiment in which additionally a dielectric layer close to the surface of the electronic peripheral device 180 designed as a PCB is designed as a material having a low modulus of elasticity, in addition to the material having a low modulus of elasticity in the electronic module 150 in eWLB architecture. The materials with the reference numerals 160, 500 may be identical. A mechanical compensatory movement may be allowed through this on both sides of the solder connection between the electronic module 150 and electronic peripheral device 180 and improved stability to temperature cycles can thus be achieved. Such an architecture is advantageous, especially for power semiconductor applications and automotive applications.

Figure 6:
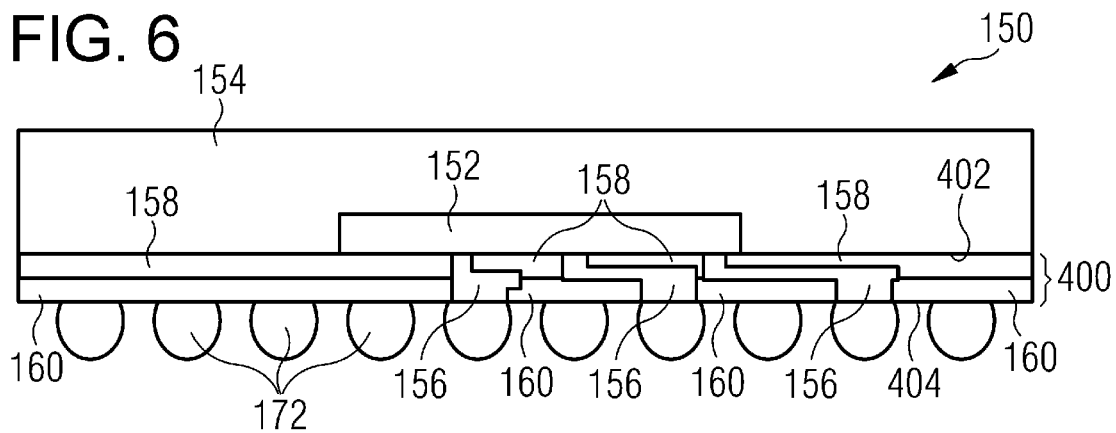
FIG. 6 and FIG. 7 are cross-sectional views of electronic modules according to other exemplary embodiments.
Figure 7:
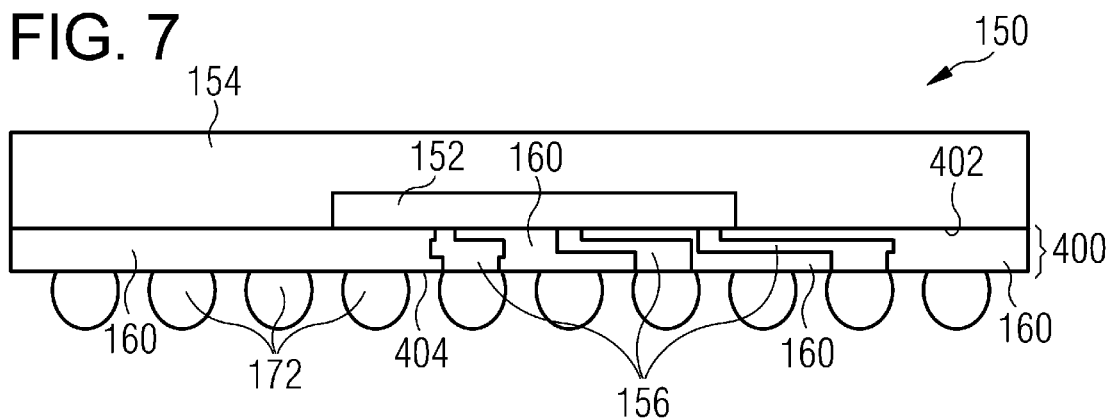

FIG. 6 and FIG. 7 show cross-sectional views of electronic modules 150 according to exemplary embodiments.

According to FIG. 6, the electrically insulating structure 158, 160 of the redistribution layer 400, in addition to the material having the low modulus of elasticity (see reference numeral 160), additionally has another material having a higher modulus of elasticity (see reference numeral 158). The other material having the higher modulus of elasticity is arranged between the electronic chip 152 encapsulated with the encapsulation structure 154 on the one hand and the material having a low modulus of elasticity on the other hand. FIG. 6 thus shows an embodiment, in which the electrically insulating structure 158, 160 within the redistribution layer or redistribution layer 400 is only partially formed from the material having a low modulus of elasticity and to another part by material having a higher modulus of elasticity to increase the robustness within the redistribution layer 400. The material 160 having a low modulus of elasticity is thereby closer to the soldering point for coupling to an electronic peripheral device 180 as the material 158 having a higher modulus of elasticity.

FIG. 7 shows an enlarged representation of the electronic module 150 according to FIG. 4 and FIG. 5.

Figure 8:
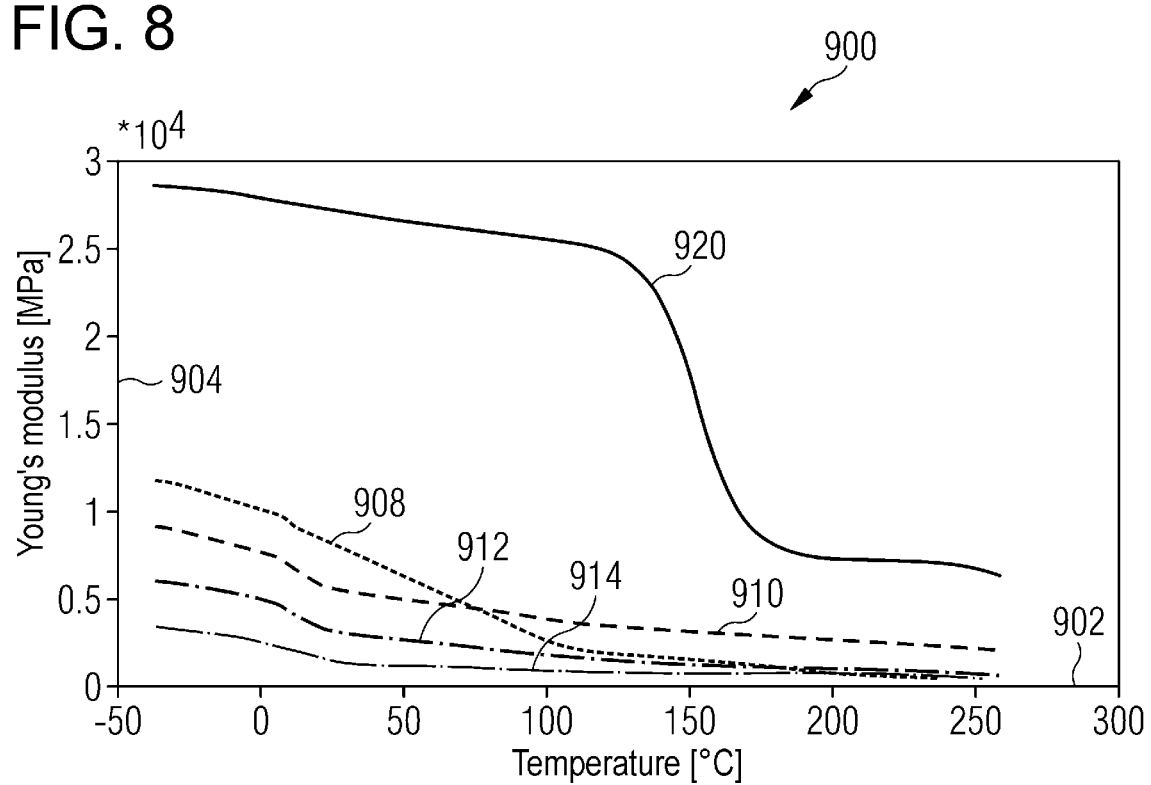
FIG. 8 is a diagram in which the temperature dependence of the value of the modulus of elasticity for different materials having a low modulus of elasticity and a comparative material having a higher modulus of elasticity are shown.

FIG. 8 shows a diagram 900 in which the temperature dependence of the value of the modulus of elasticity for four different materials with low modulus of elasticity and a reference material having a higher modulus of elasticity are shown.

The diagram 900 has an abscissa 902 along which the temperature is plotted in degrees Celsius. The value of the modulus of elasticity is plotted along an ordinate 904. While conventionally used PCB material (see curve 920) has a very high value of the modulus of elasticity, particularly at low temperatures, and therefore crack formation cannot be effectively countered, the variation of the modulus of elasticity over the range of operating temperatures (−40° C. to 150° C.) is also so great that strong mechanical stresses may occur during temperature cycles. In the exemplary embodiments according to the materials used (see curves 908, 910, 912, 914), not only are the absolute values of Young's modulus significantly lower, in particular at −40° C., but their variability over the entire temperature range is also reduced.

In addition, it should be noted that "comprising" does not exclude other elements or steps and "a" or "an" does not exclude plurality. It should be further noted that features or steps which have been described with reference to one of the above embodiments may also be used in combination with other features or steps of other exemplary embodiments described above. Reference numerals in the claims should not be construed as limiting.

What is claimed is:

1. Electronic module, comprising:
at least one electronic chip;
an encapsulation structure, in which the at least one electronic chip is at least partially encapsulated;
an electrically conductive structure for the electrically conductive contacting of the at least one electronic chip; and
an electrically insulating structure which is at least partially formed of a material having a low modulus of elasticity;
wherein a variation of the value of the modulus of elasticity is at the most 10 GPa over a temperature range between −40° C. and +150° C.;
wherein the electrically conductive structure and the electrically insulating structure form a laminated sequence of layers, on whose one main surface the at least partially encapsulated at least one electronic chip is arranged and on whose other main surface the electronic module can be mounted on an electronic peripheral device; and
wherein the electrically conductive structure is embedded as rewiring in the electrically insulating structure, so that the electrically conductive structure and the electrically insulating structure form a redistribution layer.

2. Electronic module according to claim 1, wherein the material having a low modulus of elasticity has a value of the modulus of elasticity of at the most 16 GPa at −40° C.

3. Electronic module according to claim 1, wherein the material having a low modulus of elasticity has a value of the modulus of elasticity of at the most 5 GPa over the entire temperature range between −40° C. and +150° C.

4. Electronic module according to claim 1, wherein the material having a low modulus of elasticity is selected from a group consisting of Taconics TSM-DS3, Taconics Fast-Film, Panasonic LCP R-F705T, and Rogers 3003.

5. Electronic module according to claim 1, configured as a ball grid array module, in particular as an embedded wafer level ball grid array module, or wafer level package.

6. Electronic module according to claim 1, wherein the electrically insulating structure has another material having a higher modulus of elasticity, in particular a resin-fiber glass mixture, more particularly FR-4.

7. Electronic module according to claim 6, wherein at least a part of the other material having the higher modulus of elasticity is arranged between the at least partially encapsulated at least one electronic chip on the one hand and the material having the low modulus of elasticity on the other hand.

8. Electronic module according to claim 7, comprising at least one bonding wire at least partially encapsulated in the encapsulation structure for the electrically conductive coupling of at least one chip pad on a top side of at least one electronic chip with the electrically conductive structure on a bottom side of the at least one electronic chip.

9. Electronic module according to claim 6, wherein at least a part of the material having the low modulus of elasticity is arranged between the at least partially encapsulated at least one electronic chip on the one hand and the other material having the higher modulus of elasticity on the other hand.

10. Electronic module according to claim 9, the at least one electronic chip being mounted in flip chip technology and comprising a bottom side; the electronic module further comprising at least one chip pad (170) on the bottom side of the at least one electronic chip mounted in flip chip technology, which is electrically conductively coupled to at least one chip pad on the bottom side to the electrically conductive structure.

11. Electronic module according to claim 1, wherein the electrically conductive structure is embedded as a redistribution wiring in the electrically insulating structure, so that the electrically conductive structure and the electrically insulating structure form a redistribution layer, on whose one main surface the at least one electronic chip and the encapsulation structure adjoin and on whose other main surface the electronic module can be mounted on an electronic peripheral device.

12. Electronic module according to claim 11, wherein the entire electrically insulating structure of the redistribution layer is formed from the material having the low modulus of elasticity.

13. Electronic module according to claim 11, wherein the electrically insulating structure of the redistribution layer has, in addition to the material having the low modulus of elasticity, other material having a higher modulus of elasticity.

14. Electronic module according to claim 13, wherein the other material having the higher modulus of elasticity is arranged between the at least one electronic chip at least partially encapsulated with the encapsulation structure on the one hand and the material having the low modulus of elasticity on the other hand.

15. Electronic module according to claim 1, wherein on the other main surface at least one solder structure is arranged, in particular a plurality of solder beads.

16. Electronic arrangement, comprising:
at least one electronic module according to claim 1;
an electronic peripheral device on which the at least one electronic module is mounted such that the at least one electronic chip is electrically conductively coupled to the electronic peripheral device by the electrically conductive structure.

17. Electronic arrangement according to claim 16, wherein the electronic peripheral device has an electrically insulating structure which is at least partially formed of a material having a low modulus of elasticity.

18. Method for producing an electronic module, wherein the method comprises:
at least partial encapsulating at least one electronic chip with an encapsulation structure;
forming an electrically conductive structure for the electrically conductive contacting of the at least one electronic chip; and
forming an electrically insulating structure at least partially made of a material having a low modulus of elasticity;
wherein a variation of the value of the modulus of elasticity is at the most 10 GPa over a temperature range between −40° C. and +150° C.;
wherein the electrically conductive structure and the electrically insulating structure form a laminated sequence of layers, on whose one main surface the at least partially encapsulated at least one electronic chip is arranged and on whose other main surface the electronic module can be mounted on an electronic peripheral device; and
wherein the electrically conductive structure is embedded as rewiring in the electrically insulating structure, so that the electrically conductive structure and the electrically insulating structure form a redistribution layer.

* * * * *